United States Patent
Theogarajan

(10) Patent No.: US 6,686,778 B2
(45) Date of Patent: Feb. 3, 2004

(54) HIGH VOLTAGE TOLERANT DIFFERENTIAL INPUT RECEIVER

(75) Inventor: Luke S. Theogarajan, Cambridge, MA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/935,372

(22) Filed: Aug. 22, 2001

(65) Prior Publication Data

US 2003/0038658 A1 Feb. 27, 2003

(51) Int. Cl.[7] .................................................. H03K 3/00
(52) U.S. Cl. ........................................... 327/108; 327/66
(58) Field of Search ............................ 327/108, 52, 53, 327/56, 65, 63, 66, 68, 77, 89

(56) References Cited

U.S. PATENT DOCUMENTS

| | | | | |
|---|---|---|---|---|
| 4,066,882 A | * | 1/1978 | Esposito | 714/724 |
| 5,422,523 A | * | 6/1995 | Roberts et al. | 326/68 |
| 5,559,966 A | * | 9/1996 | Cho et al. | 323/222 |
| 5,640,104 A | * | 6/1997 | Matsubara | 326/24 |
| 6,154,498 A | * | 11/2000 | Dabral et al. | 375/257 |
| 6,256,234 B1 | * | 7/2001 | Keeth et al. | 327/161 |
| 6,285,614 B1 | * | 9/2001 | Mulatti et al. | 365/207 |
| 6,373,275 B1 | * | 4/2002 | Otsuka et al. | 326/30 |

OTHER PUBLICATIONS

Sanchez, Hector et al., A Versatile 3.3/2.5/1.8–V CMOS I/O Driver Built in a 0.2 μm 3.5–nm Tox, 1.8–V CMOS Technology, IEEE Journal of Solid–State Circuits, vol. 34, No. 11, Nov. 1999.

Connor, John et al., Dynamic Dielectric Protection For I/O Circuits Fabricated in a 2.5V CMOS Technology Interfacing to a 3.3V LVTTL Bus, 1997 Symposium on VLSI Circuits Digest of Technical Papers.

Singh, Gajendra et al., High–Voltage–Tolerate I/O Buffers with Low–Voltage CMOS Process, IEEE Journal of Solid–State Circuits, vol. 34, No. 11, Nov. 1999.

* cited by examiner

Primary Examiner—Timothy P. Callahan
Assistant Examiner—Cassandra Cox
(74) Attorney, Agent, or Firm—Blakely, Sokoloff, Taylor & Zafman LLP

(57) ABSTRACT

A computer system includes at least one high-voltage device and at least one low-voltage device. The low-voltage device has at least one differential input receiver, which reduces the risk of gate oxide stress by ensuring the voltage level on the low-voltage device gate(s) is at or below a predetermined value. The low-voltage device may be a memory controller and the high-voltage device may be a memory.

15 Claims, 2 Drawing Sheets

HIGH VOLTAGE TOLERANT DIFFERENTIAL INPUT RECEIVER

BACKGROUND OF THE INVENTION

1. Field of the Invention

The present invention is directed to logic devices and, in particular, to a differential input receiver.

2. Background Information

Integrated circuit technology today is quickly moving from 0.20 micron technology to 0.17 micron technology and movement to 0.13 micron technology is anticipated in the near future. As a result, operating voltages for transistors in the integrated circuits is decreasing. As operating voltages decrease, the maximum allowed voltage that the gate of a transistor in a logic circuit decreases as well. This is due to the gate oxide voltage (oxide stress) that can be withstood by the thin gate devices commonly used.

Thin gates and concomitant limiting gate oxide voltages can be troublesome, particularly when trying to interface a high-voltage device to a low-voltage device. For example, many input/output (I/O) devices are 3.3V LVTTL compatible I/O circuits fabricated in a 2.5V CMOS technology. Voltages across the gate oxides of these devices should not exceed 3.6V. During power up, however, the voltages across the gate oxides of these devices may exceed 3.6V.

There are several existing techniques to protect gate oxides from exceeding predetermined voltage levels. One technique is described in John Connor et al., in "Dynamic Dielectric Protection for I/O Circuits Fabricated in a 2.5V CMOS Technology Interfacing to a 3.3V LVTTL Bus," in 1997 *Symposium on VLSI Circuits Digest of Technical Papers*, pages 119–120. Another technique is described in Gajendra P. Singh et al., "High-Voltage-Tolerant I/O Buffers with Low-Voltage CMOS Process," in *IEEE Journal of Solid-State Circuits*, Vol., 34, No. 11, November 1999, pages 1512–1525. Hector Sanchez et al., offers another technique in "A Versatile 3.3/2.5/1.8-V CMOS I/O Driver Built in a 0.2-m Tox, 1.8-V CMOS Technology," in *IEEE Journal of Solid-State Circuits*, Vol., 34, No. 11, November 1999, pages 1501–1511. According to these techniques, devices (i.e., transistors) are stacked or cascaded in such a way that at any point in time the voltage across the gate oxides of the devices never exceeds process tolerance. These techniques apply to single ended receivers, however, and only provide static protection.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
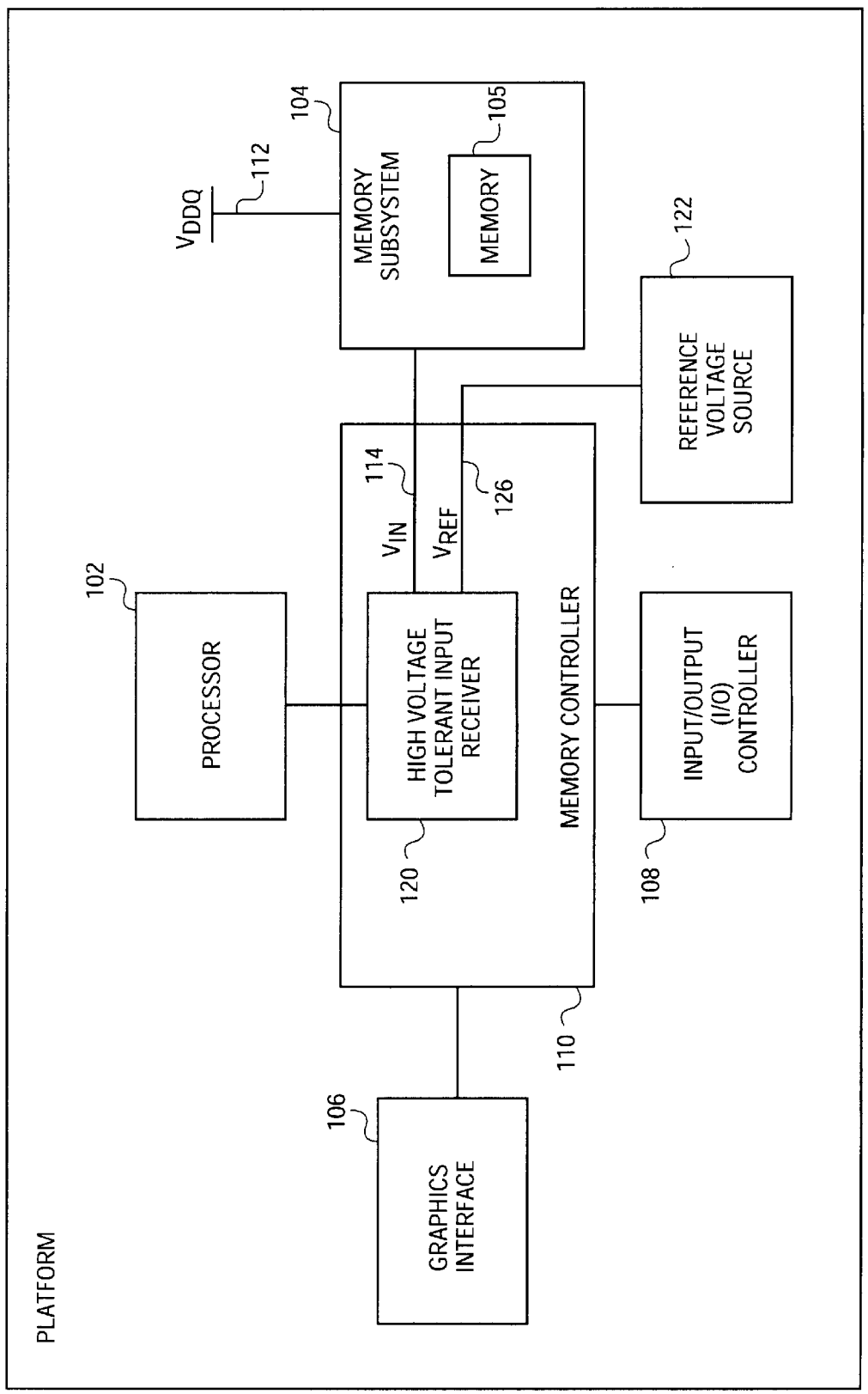
FIG. 1 is a high-level block diagram of a computer platform suitable for implementing embodiments of the present invention.

A differential input receiver to interface high-voltage logic devices to low-voltage logic devices is described in detail herein. Various aspects of the invention are described as well. However, it will be apparent to those skilled in the art that the invention may be practiced with only some or all aspects of the invention. For purposes of explanation, specific numbers, methods, materials and configurations are set forth in order to provide a thorough understanding of the invention. However, it will also be apparent to one skilled in the art that the invention may be practiced without the specific details. In other instances, well-known features are omitted or simplified in order not to obscure the invention.

Some parts of the description will be presented using terms such as particular signals, voltages, processors, and so forth, commonly employed by those skilled in the art to convey the substance of their work to others skilled in the art. Other parts of the description will be presented in terms of operations performed by a computer system, using terms such as accessing, determining, counting, transmitting, and so forth. As is well understood by those skilled in the art, these quantities and operations take the form of electrical, magnetic, or optical signals capable of being stored, transferred, combined, and otherwise manipulated through mechanical and electrical components of a computer system; and the term "computer platform" includes general purpose as well as special purpose data processing machines, systems, and the like, that are standalone, adjunct or embedded.

Various operations will be described as multiple discrete actions performed in turn in a manner that is most helpful in understanding the invention. However, the order in which they are described should not be construed to imply that these operations are necessarily order dependent or that the operations be performed in the order in which the operations are presented.

The invention is described below in farther detail with respect to several examples for illustration. Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to embodiments of the present invention, a computer system includes at least one high-voltage device and at least one low-voltage device, which has at least one differential input receiver. The differential input receiver reduces the risk of gate oxide stress by ensuring the voltage level on the low-voltage device gate(s) is at or below a predetermined value. The high-voltage device may be a memory and the low-voltage device may be a memory controller.

FIG. 1 is a high-level block diagram of a platform 100 suitable for implementing embodiments of the present invention. The platform 100 is typically a computer platform or system that supports a high-performance desktop, a workstation, a server, a mobile system, etc. In one embodiment, the platform 100 may be a UNIX platform. In other embodiments, the platform 100 may be Windows® or Windows® NT platform, or any other suitable platform. Those skilled in the art will appreciate that a variety of platforms may be used when implementing the present invention.

The platform 100 includes a processor 102, which performs its conventional functions of executing programming instructions including implementing many of the teachings of the present invention. The processor 102 can be a processor of the Pentium® processor family available from Intel Corporation of Santa Clara, Calif., or any other suitable processor.

The example platform 100 also includes a memory subsystem 104, a graphics interface 106, an input/output (I/O) controller 108, and a memory controller 110. In one embodiment, the memory subsystem 104 includes memory 105.

The memory subsystem 104 performs its conventional functions of facilitating the processor 102, the graphics interface 106, the I/O controller 108, and the memory controller 110 to access the memory 105 to read/write data and/or software (instructions). The memory 105 performs its conventional functions of storing data (pixels, frames, audio, video, etc.) and software (control logic, instructions, code, computer programs, etc.) for access by other platform components. In general, the memory 105 includes several data lines corresponding to several addressable storage locations. Memory technology is well known, and suitable memory may utilize a well-known double/dual data rate (DDR) synchronous dynamic random access memory (SDRAM) technology. The memory 105 alternatively may utilize well-known Stub Series Terminated Logic (SSTL), well-known low voltage differential signaling (LVDS) technology, or any other process technology in which the operating voltage is high relative to the operating voltage of an interfacing device.

In one embodiment, the graphics interface 106 receives commands and data from the processor 102 and generates display signals (e.g., in RGB format). Graphics interface technology is well known.

In one embodiment, the I/O controller 108 may be the interface to I/O devices (not shown), which typically are peripheral components or devices, such as printers, local disk drives, compact disk read-only-memories (CD ROMs), local area networks (LANs), sound modules, small computer system interfaces (SCSI), etc. The I/O controller 108 reads and writes to the memory 105 for the I/O devices. I/O controller technology is well known.

In one embodiment, the memory controller 110 performs its conventional functions of controlling and monitoring the status of memory 105 data lines, error checking, etc. The memory controller 110 also may be a primary interface to the processor 102, the memory subsystem 104, the graphics interface 106, and the I/O controller 110. The memory controller 110 may have a differential interface with the memory subsystem 104. Memory controller technology is well known.

In the embodiment shown in FIG. 1, the memory subsystem 104 has an operating voltage ($V_{DDQ}$) 112, which is a high voltage in relation to the operating voltage of the memory controller 110. In one embodiment, the memory controller 110 receives an input voltage ($V_{IN}$) 114 from the memory subsystem 104. When the platform 100 is operating, the input voltage ($V_{IN}$) 114 may swing between two predetermined values. When the memory subsystem 104 utilizes SSTL technology, the input voltage ($V_{IN}$) 114 swings between 0V and 2.5V.

A reference voltage ($V_{REF}$) 126 is provided by a reference voltage source 122, which although not so depicted may be an external (off-chip) voltage equal to termination voltage.

If the input voltage ($V_{IN}$) 114 swing(s) reach or exceed a predetermined value, gates in the memory controller 110 may experience oxide stress. Traditionally, the memory controller 110 gates would have static biasing circuitry to protect the gates from oxide stress. However, static protection techniques commonly utilized to interface high-voltage devices with low-voltage devices are inappropriate for interfacing differential devices such as the example memory controller 110 and the example memory subsystem 104.

A feature of the input receiver 120 is that the input receiver 120 provides a circuit solution rather than a process solution. An advantage of this feature is that input receiver 120 provides a solution to interfacing high and low-voltage devices even as process technologies change.

Figure 2:
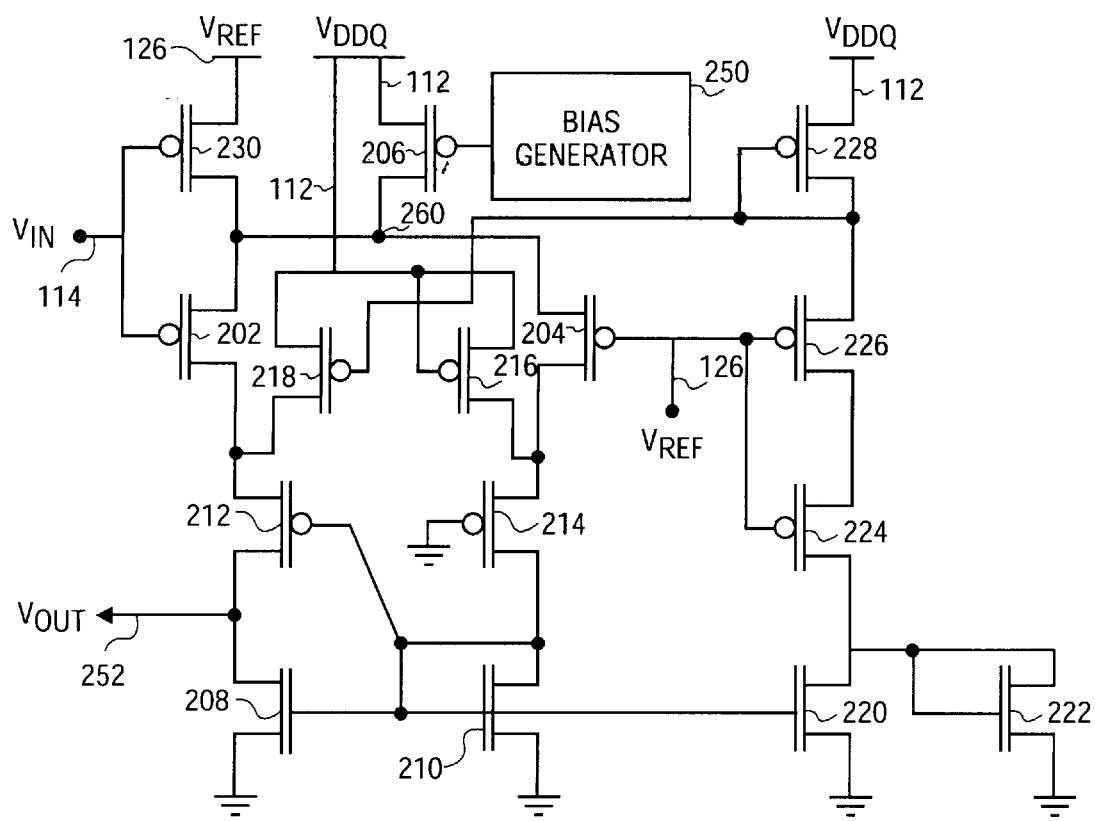
FIG. 2 is a schematic diagram of the example differential input receiver shown in FIG. 1.

FIG. 2 is a schematic diagram of the example differential input receiver 120. For purposes of explaining FIG. 2, assume the voltage ($V_{DDQ}$) 112 is a predetermined value (e.g., 2.5V), that the tolerance for voltage across the gate oxides of the differential input receiver 102 is a predetermined value (e.g., 1.3V), and that the reference voltage ($V_{REF}$) 126 is a percentage (e.g., one-half) of the voltage ($V_{DDQ}$) 112 (e.g., 1.25V).

The example differential input receiver 120 includes several transistors 202, 204, 206, 208, 210, 212, 214, 216, 218, 220, 222, 224, 226, 228, and 230. Assume further that the wells where the P-transistors in the input receiver 120 are located are tied together to the highest supply voltage (e.g., the voltage ($V_{DDQ}$) 112) of the high-voltage device interfacing with the low-voltage device (e.g., the memory controller 110). The example differential input receiver 120 also includes a bias generator 250, and an output voltage ($V_{OUT}$) 252.

The transistors 202 and 204 form a differential pair. The transistor 206 is the tail current source for the differential pair. The bias generator 250 provides the bias for the transistor 206. The transistors 208 and 210 form a load for the transistor 206 tail current source.

The transistors 210 and 212 form a negative current mirror to provide feedback control and dynamically bias the transistor 202. The transistors 214 and 216 are dummy devices for matching purposes (e.g. matching devices for the transistors 210 and 212). The transistor 218 is a current mirror. The transistors 220, 222, 224, 226, and 228 form a current mirror feedback circuit for the transistor 218 current mirror.

One embodiment of the present invention operates as follows. The input voltage ($V_{IN}$) 114 moves up and down from the reference voltage ($V_{REF}$) 126 a predetermined value (e.g., 350 mV in either direction). When the gate of the transistor 202 is 0V, the transistor 230 clamps a common node 260 of the transistors 202 and 204 to a predetermined value (e.g., below 1.3V). When the gate of the transistor 202 is at the voltage ($V_{DDQ}$) 112, the transistor 218 clamps the drain of the transistor 202. The voltage drop across the gate-source junction of the transistor 202 is held to a predetermined value (e.g., below 1.3V) by the source follower action of the transistors 202 and 204.

When the transistor 204 is steering current through the differential pair of transistors 202 and 204, the drain of the transistor 202 is decoupled from the transistor 208 by the transistor 212. The transistors 220, 222, 224, 226, and 228 activate the transistor 218, which holds the gate-drain junction of the transistor 202 at a predetermined value (e.g., below 1.3V).

The transistor 204 has a fixed gate voltage (e.g., the reference voltage ($V_{REF}$) 126) and has terminal voltages within a predetermined value (e.g., process limits). This is because when the reference voltage ($V_{REF}$) 126 is one-half the voltage ($V_{DDQ}$) 112 the voltage drop across the gate-source junction and/or the gate-drain junction of the transistor 204 is one-half of the voltage ($V_{DDQ}$) 112 as well, when devices are chosen correctly. Of course, after reading the description herein, persons of ordinary skill in the relevant art(s) will know how to select devices for different voltage levels to ensure junction voltages remain within predetermined voltage levels.

When the transistor 202 is steering current, there is essentially no current carried by the transistor 204. In this case, the transistor 212 presents a short circuit and the transistor 208 presents an open circuit. The output voltage ($V_{OUT}$) 252 is held at a predetermined value (e.g. 1.3V) by the voltage drops across the transistors 202, 206, and 212.

In an alternative embodiment, the input voltage ($V_{IN}$) 114 swings between a predetermined value (e.g., 0V) and the voltage ($V_{DDQ}$) 112. In this embodiment, the input receiver 120 operates substantially the same except that when the gate of the transistor 202 is 0V or the voltage ($V_{DDQ}$) 112, the transistor 230 clamps the common node 260 between the transistors 202 and 204 to the reference voltage ($V_{REF}$) 126.

Although embodiments of the present invention are sometimes described with reference to interfacing a memory subsystem and associated memory with a memory controller, embodiments of the present invention are directed to interfacing any low-voltage logic devices with high-voltage logic devices.

Aspects of the invention can be implemented using hardware, software, or a combination of hardware and software. Such implementations include state machines, application specific integrated circuits (ASICs), field programmable gate arrays, (FPGA), etc. In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a low-voltage device having a differential input receiver coupled to receive an output from a high-voltage device to maintain a voltage level on at least one gate in the differential input receiver at below or a predetermined value;
a pair of transistors coupled to each other differentially and to receive an input voltage;
a negative current mirror coupled to the pair of transistors; and
a set of clamping transistors to clamp voltage drops across a gate-drain junction and a gate-source junction of at least one transistor in the pair of transistors towards a predetermined level in response to a voltage input on the differential input receiver.

2. The apparatus of claim 1, wherein the predetermined level is a reference voltage.

3. The apparatus of claim 1, further comprising a tail current source coupled to the pair of transistors.

4. The apparatus of claim 3, further comprising a bias generator coupled to bias the tail current source.

5. The apparatus of claim 1, further comprising a load coupled to the pair of transistors.

6. The apparatus of claim 1, further comprising a current mirror feedback circuit coupled to the pair of transistors to mirror the current through a clamping transistor in the set of clamping transistors.

7. The apparatus of claim 6, further comprising a peripheral device operating voltage coupled to the current mirror feedback circuit.

8. An apparatus, comprising:
an integrated circuit having:
a differential pair of transistors comprising a first differential transistor and a second differential transistor, wherein a gate of the first differential transistor is coupled to a differential input terminal;
a first clamping transistor coupled to clamp a drain of first differential transistor towards a reference voltage when a voltage on the differential input terminal reaches a first predetermined value;
a second clamping transistor coupled to clamp common source terminals of the first and second differential transistors towards the reference voltage when the voltage on the differential input terminal reaches a second predetermined value; and
a negative current mirror coupled to dynamically bias the first differential transistor.

9. The apparatus of claim 8, further comprising a tail current source coupled to the differential pair of transistors.

10. The apparatus of claim 9, further comprising a bias generator coupled to bias the tail current source.

11. The apparatus of claim 10, further comprising a load coupled to the differential pair of transistors.

12. The apparatus of claim 10, further comprising a current mirror feedback circuit coupled to the differential pair of transistors to mirror the current through the first clamping transistor.

13. The apparatus of claim 12, further comprising a peripheral device operating voltage coupled to the current mirror feedback circuit.

14. The apparatus of claim 13, further comprising set of dummy devices coupled to match the negative current mirror.

15. The apparatus of claim 8, further comprising set of dummy devices coupled to match the negative current mirror.

* * * * *

UNITED STATES PATENT AND TRADEMARK OFFICE
CERTIFICATE OF CORRECTION

PATENT NO. : 6,686,778 B2
DATED : February 3, 2004
INVENTOR(S) : Theogarajan

It is certified that error appears in the above-identified patent and that said Letters Patent is hereby corrected as shown below:

<u>Column 2,</u>
Line 33, delete "farther", insert -- further --.

Signed and Sealed this

Thirtieth Day of March, 2004

JON W. DUDAS
*Acting Director of the United States Patent and Trademark Office*